(12) United States Patent
Hajjar

(10) Patent No.: US 6,462,606 B2
(45) Date of Patent: Oct. 8, 2002

(54) CIRCUIT AND METHOD FOR INPUT TO FAILSAFE "AND" GATE

(75) Inventor: Thomas Hajjar, Satellite Beach, FL (US)

(73) Assignee: GE Harris Railway Electronics, LLC, Erie, PA (US)

(*) Notice: Subject to any disclaimer, the term of this patent is extended or adjusted under 35 U.S.C. 154(b) by 0 days.

(21) Appl. No.: 09/750,378

(22) Filed: Dec. 28, 2000

(65) Prior Publication Data

US 2001/0048316 A1 Dec. 6, 2001

Related U.S. Application Data

(60) Provisional application No. 60/173,767, filed on Dec. 30, 1999.

(51) Int. Cl.[7] ................................................. G05F 1/00
(52) U.S. Cl. ....................................... 327/519; 327/520
(58) Field of Search .......................... 327/20, 519, 520; 361/18, 33, 86; 318/466, 479

(56) References Cited

U.S. PATENT DOCUMENTS 4,270,809 A * 6/1981 Ohmori et al. ............... 303/92

FOREIGN PATENT DOCUMENTS

DE 2759260 3/1985
JP 55134540 10/1980

* cited by examiner

Primary Examiner—Kenneth B. Wells
(74) Attorney, Agent, or Firm—Carl A. Rowold; Armstrong Teasdale LLP

(57) ABSTRACT

A method for generating signals for input to a vital "AND" gate includes generating a plurality of independent signals for input to the "AND" gate and checking that each of the signals has a frequency and duty cycle within predetermined ranges. Upon a determination that one of the signals exhibits an inactive state or has a frequency or duty cycle outside the predetermined ranges, generation of another of the signals is stopped. This method eliminates a need for physical filters where the input signals are generated independently by computer subsystems.

19 Claims, 1 Drawing Sheet

CIRCUIT AND METHOD FOR INPUT TO FAILSAFE "AND" GATE

CROSS REFERENCE TO RELATED APPLICATIONS

This application claims the benefit of U.S. provisional application Serial No. 60/173,767, filed Dec. 30, 1999.

BACKGROUND OF THE INVENTION

This invention relates generally to electrical circuit components and, more specifically, to components that fail under fail-safe conditions.

As generally understood in the art, a vital component of a system is one that is configured to fail only under fail-safe conditions. For example, a vital relay in a control system operates under the closed circuit principle and thus is normally held energized with its front contacts closed. When the vital relay fails, the front contacts open. Failure, then, of a circuit that drives a vital relay de-energizes the relay, leaving the relay front contacts open. Logic elements such as "AND" gates often are required to be vital. Any failure of a vital "AND" gate must not result in a permissive, e.g. "on", output by the gate.

Although a system such as a vital relay driver circuit may contain non-vital elements, higher-level vital components within the system serve to render failure modes of the non-vital elements irrelevant to fail-safe operation of the total system. When input signals to a vital "AND" gate are independently vital, the gate performs a classic "AND" function in a fail-safe manner. However, when input signals to a vital "AND" gate are not independently vital, it must be confirmed that the signals are appropriate for vital "AND" gate input. Thus signals that are fail-safe from an "on/off" standpoint but not with respect to frequency stability must be confirmed to have frequencies and duty cycles appropriate for vital "AND" gate input.

A vital "AND" gate may also operate in a fail-safe manner using independently generated non-vital signals as inputs, where it is assumed that simultaneous failures will not occur in the independent processes that generate the input signals. Such signals also must be confirmed to have frequencies and duty cycles appropriate for vital "AND" gate input. It is known to filter such signals using vital filters tuned to expected input signal frequencies. Physical filters are often used for this purpose. Where a larger system including the vital "AND" gate also includes computer or processor subsystems, it would be desirable to make use of such available digital resources in place of physical filters.

BRIEF SUMMARY OF THE INVENTION

In one embodiment, a method for generating signals for input to a vital "AND" gate includes generating a plurality of independent signals for input to the "AND" gate and checking that each of the signals has a frequency and duty cycle within predetermined ranges. Upon a determination that one of the signals exhibits an inactive state or has a frequency or duty cycle outside the predetermined ranges, generation of another of the signals is stopped.

The method further includes cross-connecting a plurality of independent processors, using the independent processors to generate the independent signals, and using each of the processors to check that another processor signal has a frequency and duty cycle within predetermined ranges. One of the processors is caused to stop its own signal generation upon a determination that another processor signal asserts an inactive state or has a frequency or duty cycle outside the predetermined ranges.

The above-described method eliminates a need for physical filters where the input signals are generated independently by computer subsystems. Thus computer subsystems for performing other system tasks can be used also to perform the above-described filtering function.

DETAILED DESCRIPTION OF THE INVENTION

Although embodiments of a circuit for input to a vital "AND" gate are described herein with reference to microcontrollers, the term "microcontroller" as used herein is used generally to refer not only to microcontrollers, but also to central processing units, microprocessors, computers, and any other processor and controller that can be operated as described below. Additionally, although embodiments of a circuit for input to a vital "AND" gate are described in connection with a two-input "AND" gate, more than two "AND" gate input signals are generated in alternative embodiments.

Figure 1:
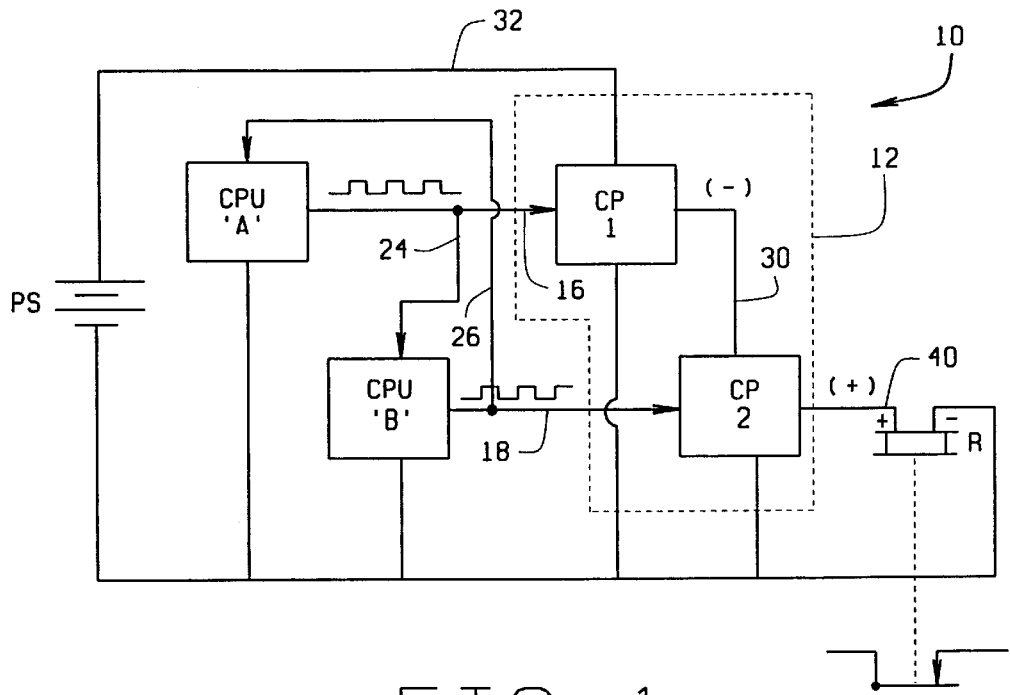
FIG. 1 is a block diagram of microcontrollers connected to a vital "AND" gate including charge pumps in accordance with one embodiment of the present invention.

Referring now specifically to the drawings, FIG. 1 is a block diagram of a system 10 including microcontrollers A and B and a vital two-input "AND" gate 12 including charge pumps CP1 and CP2. System 10 in one embodiment is a part of a larger system (not shown) in which one or both of microcontrollers A and B are used to perform other additional functions unrelated to the present invention. In an alternative embodiment, neither of microcontrollers A and B is used to perform other additional functions unrelated to the present invention. Additionally, in another alternative embodiment, vital "AND" gate 12 is of a form other than as illustrated in FIG. 1, and the "AND" gate configuration including charge pumps CP1 and CP2 is exemplary only.

Because "AND" gate 12 is vital, an input signal to gate 12 that is not independently vital must be confirmed to have an active state asserted by a waveform of predetermined frequency and duty cycle, and to have an inactive (also fail-safe) state asserted by a zero voltage. Thus a method for generating signals for input to vital "AND" gate 12 includes the steps of generating two independent signals for input to "AND" gate 12, checking that each of the signals has a frequency and duty cycle within predetermined ranges, and, upon determining that one of the signals asserts an inactive state or has a frequency or duty cycle outside the predetermined ranges, stopping generation of the other signal.

More specifically and referring to FIG. 1, microcontroller A supplies an input 16 to charge pump CP1 and microcontroller B supplies an input 18 to charge pump CP2. Microcontrollers A and B are cross-connected. More specifically, an output 24 of microcontroller A is supplied to microcontroller B and an output 26 of microcontroller B is supplied to microcontroller A. Charge pumps CP1 and CP2 of "AND" gate 12 are cascaded, i.e. an output 30 of charge pump CP1 is utilized to energize charge pump CP2. A power supply PS is configured to energize charge pump CP1 via an input 32. An output 40 of charge pump CP2 is supplied to a device that responds only to a predetermined voltage magnitude and polarity, e.g. a biased-neutral relay R. Because charge pump "AND" gate circuit 12 is vital, if relay R inputs are removed, i.e., at least one of charge pumps C1 and C2 fails, relay R is turned off when a DC current through relay R drops below a holding current, and relay R drops out or opens.

In operation, and as further described below, "AND" gate 12 drives biased-neutral relay R only if: (a) microcontroller A, independently of microcontroller B, generates a waveform output 24 (i.e. input 16 to charge pump CP1) having a frequency and duty cycle predetermined as exhibiting an active state, (b) microcontroller B, independently of microcontroller A, also generates a waveform output 26 (i.e. input 18 to charge pump CP2) that also has a frequency and duty cycle predetermined as exhibiting an active state, and (c) components of "AND" gate 12 are operating normally. If either or both independent inputs exhibit an inactive (also fail-safe) state as described above, one of only two possible outcomes results: either a zero voltage at an output 40 of "AND" gate 12, or a voltage of polarity opposite a voltage polarity to which relay R is configured to respond. Both results are fail-safe conditions.

More specifically, frequency and duty cycle ranges exhibiting an active state for a vital "AND" gate 12 input signal are predetermined and programmed into, e.g., microcontrollers A and B for access by microcontrollers A and B as further described below. Microcontroller A, for example, is programmed to compare the frequency and duty cycle of the waveform received from microcontroller B to a range of frequencies and a range of duty cycles that are predetermined as exhibiting an active state for a microcontroller B output signal. If microcontroller A determines that the microcontroller B signal frequency or duty cycle is outside the predetermined ranges, or if microcontroller A detects a microcontroller B output of zero voltage, microcontroller A stops generating its own waveform output.

Similarly, microcontroller B is programmed to compare the frequency and duty cycle of the waveform received from microcontroller A to a range of frequencies and a range of duty cycles that are predetermined as exhibiting an active state for a microcontroller A output signal. If microcontroller B determines that the microcontroller A signal frequency or duty cycle is outside the predetermined ranges, or if microcontroller B detects a microcontroller A output of zero voltage, microcontroller B stops generating its own waveform output.

If both waveforms are found respectively by microcontrollers A and B to be within the programmed ranges, then microcontrollers A and B continue to independently generate waveform outputs. In one embodiment, because microcontrollers A and B are programmed to perform the above-described frequency and duty cycle checks, a need for physical filters for the two pulse trains is eliminated. Waveforms, for example, square waves, are generated by microcontrollers A and B, for example, using a fifty-percent duty cycle. In one embodiment, frequency and duty cycle ranges programmed for active-state microcontroller A output differ from those programmed for active-state microcontroller B output.

As described above, charge pump CP1 receives, e.g. a square waveform output from microcontroller A, and charge pump CP2 receives a square waveform output from microcontroller B. Each of charge pumps CP1 and CP2 is a voltage doubling circuit, and each of charge pumps CP1 and CP2 outputs a DC signal having a polarity opposite to the charge pump input voltage polarity. Accordingly and as shown in FIG. 2, during normal operation, for example, charge pump CP1 outputs a DC signal having a negative polarity and charge pump CP2 outputs a DC signal having a positive polarity.

Figure 2:
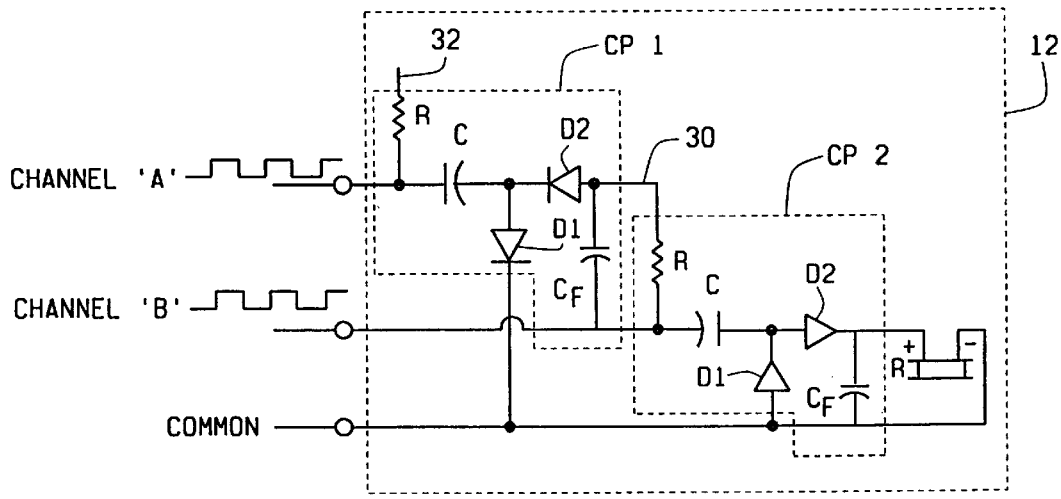
FIG. 2 is a circuit schematic diagram of the charge pumps shown in FIG. 1.

Referring to FIG. 2, each of charge pumps CP1 and CP2 includes a switch SW1 (not shown), a charge capacitor C, a filter capacitor $C_F$ and control diodes D1 and D2. Power source PS supplies a biasing voltage of, for example, +24 volts to switch SW1 of charge pump CP1 via input 32. Voltage is supplied to switch SW1 of charge pump CP2 from output 30 of charge pump CP1.

Provided that all other "AND" gate 12 components are operating normally, charge pump CP2 generates a positive DC voltage signal to energize, or activate, relay R. If the square waveform signal from microcontroller A is halted or interrupted, then charge pump CP1 is biased to generate a DC voltage of polarity opposite to a voltage polarity required to energize relay R. Relay R thus is de-energized, i.e. a fail-safe state is obtained. Also, if the square waveform signal from microcontroller B is halted or interrupted, then, as a result, another fail-safe condition occurs, i.e. charge pump CP2 does not generate a DC voltage signal, and thus a zero voltage signal is supplied to relay R. The above described charge pump circuit 12 thus is used to "AND" the two input signals from microcontrollers A and B together.

The above-described method facilitates filtering of signals which, although not independently vital, can be combined via a vital "AND" gate to provide a vital input for operating such devices as vital relays. Where this method can be implemented using independent computer subsystems, a need for physical filters is eliminated.

While the invention has been described in terms of various specific embodiments, those skilled in the art will recognize that the invention can be practiced with modification within the spirit and scope of the claims.

What is claimed is:

1. A method for generating signals for input to a vital "AND" gate, said method comprising the steps of:
   generating a plurality of independent signals for input to the "AND" gate;
   upon determining that one of the signals asserts an inactive state or has a frequency or duty cycle outside the predetermined ranges, stopping generation of another of the signals;
   cross-connecting a plurality of independent processors;
   using the independent processors to generate the independent signals;
   using each of the processors to check that another processor signal has a frequency and duty cycle within predetermined ranges; and
   causing one of the processors to stop its own signal generation upon determining that another processor signal asserts an inactive state or has a frequency or duty cycle outside the predetermined ranges.

2. A method in accordance with claim 1 wherein said step of using each of the processors to check that another processor signal has a frequency and duty cycle within predetermined ranges comprises the steps of:
   providing as an input to each processor the independent signal generated by another processor; and
   using each of the processors to compare the other processor signal frequency and duty cycle to frequency and duty cycle ranges predetermined for a vital input to the "AND" gate.

3. A method in accordance with claim 2 further comprising the steps of:

predetermining the frequency and duty cycle ranges exhibiting an active state for a vital input signal; and programming the frequency and duty cycle ranges for access by the processors.

4. A method in accordance with claim 3 wherein the frequency and duty cycle ranges for an active-state signal output by one of the processors differ from the frequency and duty cycle ranges for an active-state signal output by another of the processors.

5. A method in accordance with claim 1 wherein the independent signals include pulse trains.

6. A method in accordance with claim 5 wherein the pulse trains include square waveforms having fifty-percent duty cycles.

7. A method in accordance with claim 1 further comprising the step of continuing to generate the plurality of independent signals for so long as each of the signals is within the predetermined ranges.

8. A method for filtering input to a vital "AND" gate, said method comprising the steps of:

using a plurality of cross-connected independent processors to generate independent signals for input to the "AND" gate;

checking that each of the independent signals has a frequency and duty cycle range within predetermined ranges; and upon a determination by one of the processors that one of the signals exhibits an inactive state or has a frequency or duty cycle outside the predetermined ranges, causing the determining processor to stop generating its own independent signal.

9. A method in accordance with claim 8 further comprising the step of causing each of the processors to continue generating its independent signal for so long as all of the processors continue to generate independent signals within the predetermined ranges.

10. A system for generating signals for input to a vital "AND" gate, said system comprising a plurality of processors, each said processor configured to generate an independent signal for input to the "AND" gate and to supply its independent signal to another of said processors.

11. A system in accordance with claim 10 wherein said another processor configured to check whether a received signal asserts an active state.

12. A system in accordance with claim 11 wherein said another processor further configured to check whether the received signal has a frequency and duty cycle within ranges predetermined for a vital input to the "AND" gate.

13. A system in accordance with claim 10 wherein at least one of said processors is further configured to generate a pulse train for input to the "AND" gate.

14. A system in accordance with claim 10 wherein at least one of said processors is further configured to generate a square waveform having a fifty-percent duty cycle for input to the "AND" gate.

15. A system in accordance with claim 12 wherein said another processor is further configured to stop generating its own independent signal upon determining that the received signal is not within the predetermined vital "AND" gate input ranges.

16. A system in accordance with claim 12 wherein said another processor is further configured to stop generating its own independent signal upon determining that the received signal asserts an inactive state.

17. A system in accordance with claim 12 wherein said another processor is further configured to continue generating its own independent signal for so long as the received signal is within the predetermined vital "AND" gate input ranges.

18. A system in accordance with claim 10 further configured to generate signals for input to a vital "AND" gate without using physical filters.

19. A system in accordance with claim 10 wherein the "AND" gate is configured to receive two input signals, said system comprising two processors, each of said two processors configured to generate an independent signal for input to the "AND" gate, each of said two processors configured to supply its independent signal to the other of said two processors.

* * * * *